(12) United States Patent
Tamura et al.

(10) Patent No.: US 7,360,012 B2
(45) Date of Patent: Apr. 15, 2008

(54) SEMICONDUCTOR MEMORY DEVICE INCLUDING MEMORY CONTROLLER FOR TRANSMITTING WRITING RATE INFORMATION TO MEMORY ACCESS DEVICE

(75) Inventors: Kazuaki Tamura, Toyono-gun (JP); Tomoaki Izumi, Neyagawa (JP); Tetsushi Kasahara, Katano (JP); Masahiro Nakanishi, Yawata (JP); Kiminori Matsuno, Katano (JP); Takuji Maeda, Neyagawa (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 410 days.

(21) Appl. No.: 11/048,046

(22) Filed: Feb. 2, 2005

(65) Prior Publication Data

US 2005/0235098 A1    Oct. 20, 2005

(30) Foreign Application Priority Data

Feb. 4, 2004    (JP)    ............................... 2004-027688

(51) Int. Cl.
 G06F 12/00    (2006.01)
 G06K 17/00    (2006.01)
 G06K 19/07    (2006.01)
(52) U.S. Cl. .................... 711/103; 711/115; 711/156; 711/167
(58) Field of Classification Search ............... None
See application file for complete search history.

(56) References Cited

U.S. PATENT DOCUMENTS 5,579,502 A * 11/1996 Konishi et al. ............. 711/103
6,219,768 B1 * 4/2001 Hirabayashi et al. ....... 711/154
6,611,907 B1 * 8/2003 Maeda et al. ............... 711/170
6,937,526 B2 * 8/2005 Furukawa ............... 365/189.05
7,039,754 B2 * 5/2006 Sasaki ......................... 711/103
7,039,786 B2 * 5/2006 Suzuki et al. ............... 711/173
7,051,128 B2 * 5/2006 Bando ......................... 710/100
7,065,608 B2 * 6/2006 Nakanishi ................... 711/103
7,143,261 B2 * 11/2006 Maeda et al. ............... 711/170
7,185,140 B2 * 2/2007 Nakajima ................... 711/103
2003/0196027 A1 * 10/2003 Maeda et al. ............... 711/103
2003/0196028 A1 * 10/2003 Maeda et al. ............... 711/103
2004/0027881 A1 * 2/2004 Furukawa ................... 365/200
2004/0264935 A1 * 12/2004 Nakajima ..................... 386/95
2005/0060513 A1 * 3/2005 Maeda et al. ............... 711/172
2006/0036804 A1 * 2/2006 Shiota et al. ................ 711/103

FOREIGN PATENT DOCUMENTS

JP        5-049000 A       2/1993
JP     2001-245249 A       9/2001
JP     2006059287 A  *    3/2006

* cited by examiner

Primary Examiner—Kevin Verbrugge
(74) Attorney, Agent, or Firm—Smith Patent Office

(57) ABSTRACT

A semiconductor memory card 1 includes a user data area 21 and a management information area 22, in a data storing unit 2. According to a writing test command from a memory access device 6, a memory controller 3 writes data into a user data storing area and measures the writing rate, and transmits the measurement result to the memory access device 6 via a host interface unit 4. Thereby, the memory access device 6 can recognize the writing rate.

9 Claims, 15 Drawing Sheets

FIG. 8

| PBA | Sector number | Use states |
|---|---|---|
| 0 | 0 | not used |
| | ⋮ | ⋮ |
| | 31 | not used |
| 1 | 0 | used |
| | ⋮ | ⋮ |
| | 15 | used |
| | 16 | not used |
| | ⋮ | ⋮ |
| | 31 | not used |
| ⋮ | 0 | used |
| | ⋮ | ⋮ |
| | 31 | used |
| M | 0 | not used |
| | ⋮ | ⋮ |
| | 31 | not used |

FIG. 9

| PBA | Sector number | Writing period (μs) |
|---|---|---|
| 1 | 16 | 190 |
|  | 17 | 200 |
|  | ⋮ | ⋮ |
| ⋮ | 0 | 210 |
|  | ⋮ | ⋮ |

T1

| | |
|---|---|
| Minimum value (μs) | 180 |
| Maximun value (μs) | 230 |
| Average value (μs) | 200 |
| Total value (ms) | 11.4 |
| Data writing size (kB) | 16 |

T2

SEMICONDUCTOR MEMORY DEVICE
INCLUDING MEMORY CONTROLLER FOR
TRANSMITTING WRITING RATE
INFORMATION TO MEMORY ACCESS
DEVICE

The text of Japanese priority application No. 2004-27688 filed on 4 Feb. 2004 is hereby incorporated by reference.

BACKGROUND OF THE INVENTION

1. Field of the Invention

The present invention relates to a semiconductor memory device, a memory controller and a memory access device for accessing a semiconductor memory device.

2. Description of Related Art

Recording media for recording music contents and digital data such as image data include various types such as magnetic disks, optical disks and magneto-optical disks. A semiconductor memory card, which is one of these recording media, uses a semiconductor memory such as a flush memory as a recording element, for the purpose of miniaturizing the recording media. Therefore, as described in Japanese Patent Application Laid-open No. 2001-245249, a use of a semiconductor memory card is rapidly spread in a small portable device such as a digital still camera and a cellular phone unit. At the same time, a higher transfer rate, for example, at the time of data writing is accelerated in order to respond to demands for higher definition digital data, for example, higher-resolution image even in portable device.

In a semiconductor memory card which is built in a semiconductor memory device, a NAND-type flash memory is used as a memory. A NAND-type flash memory has a characteristic that data which has been written on the destination must be erased first before writing data so as to be in a clean state, and then data is written.

A unit for erasing data is called an erasure block managed as a block consisting of a number of sectors, each of which is the smallest accessible unit. FIG. 1 is a diagram showing an exemplary relationship between erasure blocks and sectors. In FIG. 1, a flash memory consists of N number of erasure blocks from (EB)0 to EB(N−1). One erasure block is composed of 32 sectors. Each sector is provided with a physical sector number PSN. Although it is possible to access by a sector (for example, 512 bytes), erasure processing required before writing is performed by an erasure block (16 kB).

An example of processing to erase data and write in the semiconductor memory card will be explained with reference to FIGS. 2 and 3. FIG. 2 shows, as an example of write processing, a processing procedure inside the semiconductor memory card in a case of writing data having a multiple length of an erasure block. In FIG. 2, first, the semiconductor memory card receives a command and an argument transmitted from an memory access device (S201). Next, by referring to the received command, the semiconductor memory card judges whether the command is an incorrect command being unrecognizable by itself (S202). If it is an incorrect command, the semiconductor memory card notifies the memory access device of an error and ends the processing (S203). If the command is a recognizable command, the semiconductor memory card judges whether the command is a write command (S204). If the command is other than a write command, the semiconductor memory card performs another processing corresponding to each command (S205). If it is a write command, the semiconductor memory card determines the physical address of an erasure block into which data is written in the flash memory based on information about the write position and the write size stored in the argument (S206). Next, prior to the writing, the semiconductor memory card erases data exiting in the erasure block determined in S206 in the flash memory via a memory controller (S207). Next, the semiconductor memory card receives data for one sector from the memory access device (S208). Upon completion of the data reception, the semiconductor memory card writes the received data for one sector on the flash memory (S209). In this way, the semiconductor memory card repeatedly performs the data receiving and the write processing of S208 and S209 until data writing for one erasure block is completed (S210). The semiconductor memory card repeatedly performs the data writing processing for one erasure block from S206 to S210 until data writing for the writing size designated by the memory access device is completed (S211). Upon completion of data writing for the writing size designated by the memory access device, the semiconductor memory card ends the processing.

FIG. 3 shows a processing procedure inside the semiconductor memory card in a case of data writing for one sector. In a NAND-type flash memory, it is required to erase data before data writing. Since this erasure processing can be performed only by an erasure block unit, even when data for one sector is written, it is required to perform data erasure for one erasure block. The different aspects of the data write processing in FIG. 3 from the processing in FIG. 2 are, before the data erasure for one erasure block in S307, the data is copied in different location temporarily and erased, and among pieces of data included in an erasure block into which writing is performed in S310, the copied pieces of data other than data for one sector, to be received from the memory access device, are rewritten on the erasure block determined in S306.

As shown in FIGS. 2 and 3, data write processing includes three kinds of processing in large, that is, command interpretation processing, data erasure processing and data write processing. Here, assuming a flash memory in which an overhead of command interpretation takes 3 ms, write processing for one sector takes 200 µs, and erasure processing for one erasure block (16 kB) takes 2 ms. In writing for one erasure block (16 kB) of this flash memory, processing shown in FIG. 2 is performed, and command interpretation takes 3 ms, erasure processing takes 2 ms, and write processing takes 32*200 µs, that is, 11.4 ms in total. Similarly, in writing for one sector (512B), processing shown in FIG. 3 is performed, and command interpretation takes 3 ms, erasure processing takes 2 ms, and write processing takes 200 µs plus 31*200 µs, that is, 11.4 ms in total.

In other words, the cases where 16 kB data is written and where 512B data is written take almost similar time periods. Although this example shows a case in which an extreme performance difference is caused by not taking into account the data transfer periods and the like, even in an actual flash memory, it is generally known that the writing period becomes minimum when writing is performed by erasure block unit.

Further, in a semiconductor memory card, a plurality of flash memories may be used as recording elements. FIG. 4 shows an exemplary configuration of a semiconductor memory card in which two flash memories FM1 and FM2 are built-in. In each of the two flash memories shown in FIG. 4, one erasure block consists of 32 sectors. The respective sectors existing in the two flash memories are assigned with physical sector numbers of the ascending order so that the two flash memories are switched by 32 sector units. In the case of a semiconductor memory card composed of the plural number of flash memories, it is possible to realize a high-speed access by configuring the semiconductor memory card such that read and write processing is performed in parallel to the plural number of flash memories. For example, assuming that the physical sector number in the example of FIG. 4 is PSN, when data is written on the 64 sectors from PSN0 to PSN63, it is possible to write data at a high speed by writing data into two erasure blocks (EB) 0_0 and 1_0 in parallel.

FIG. 5(*a*) shows an example of timing of writing on one erasure block in the case where a semiconductor memory card is composed of the two flash memories shown in FIG. 4, and FIG. 5(*b*) shows an example of timing of writing on two erasure blocks in parallel in the same case. In FIGS. 5(*a*) and 5(*b*), T1 indicates a time period for write processing of one erasure block, and T1'+T2' indicates a time period for write processing of two erasure blocks in parallel. That is, when data is written in twice by one erasure block at each time, the write processing time is T1\*2, and when data is written on two erasure blocks in parallel, the write processing time is T1'+T2'. Since the data is written on the two flash memories in parallel in the latter case, T1 and T2' become almost similar time periods. Therefore, in the examples of FIGS. 5(*a*) and 5(*b*), write period becomes minimum when writing is performed to the semiconductor memory card by two erasure block units.

The conventional art described above contains the following problems. That is, the transfer rate of data changes significantly depending on the used state of data recording block, the write starting position, an erasure unit and the like. In other words, writing period to a semiconductor memory card depends not only on the size of an erasure block but also on the number of flash memories used in the semiconductor memory card, the management method of the flash memory, and the like. The access performance of a semiconductor memory card differs depending on the generation and the manufacturer of the semiconductor memory card. That is, the transfer rate differs significantly depending on the inner structure of the card, and also the states of sectors, which cannot be known to the memory access device.

Therefore, when, for example, moving image recording is performed by a digital still camera or the like in real time, data write processing may not be able to follow data capture processing depending on the type of a semiconductor memory card, which may cause a case that data recording cannot be performed correctly.

To cope with this, in Japanese Patent Application Laid-open No. 2001-245249, a memory access device such as a digital still camera is so configured as to be able to obtain beforehand information such as the manufacturer's name of a semiconductor memory card to be used, the capacity of the memory card, the transfer method, and the like. Moreover, the memory access device is so configured as to, before data writing, test transfer methods beforehand, and select one transfer method among one or more transfer methods applicable to the semiconductor memory card to be used, and then perform data transfer.

However, this conventional memory access device does not have a unit for acquiring the inner state of the semiconductor memory card, that is, the use state of data recording blocks, a data writing and erasing unit being unique to the semiconductor memory card, and the like. Therefore, in the transfer test of the conventional art, there is a shortcoming that accurate transfer rate information cannot be obtained.

SUMMARY OF THE INVENTION

The present invention has been developed in view of these conventional problems. An object of the present invention is to enable a memory access device to obtain writing rate information by transmitting information inside a semiconductor memory device to the memory access device.

The semiconductor memory device of the present invention comprises: a nonvolatile data storing unit having a user data area for storing information and a management information area for storing management information of the semiconductor memory device; a RAM for storing data temporarily; a host interface unit for receiving a command issued from a memory access device and data, and providing a response from the semiconductor memory device and data to the memory access device; and a memory controller for controlling the host interface unit, the data storing unit and the RAM, wherein when a writing test command is given from the memory access device, the memory controller performs a writing test to an area determined according to an inner state of the semiconductor memory device, and notifies the memory access device of a measurement result of a writing period. A memory controller of the present invention is the memory controller that is used in the device described above.

The memory access device, of the present invention, for writing data by accessing the semiconductor memory device is the memory access device that comprises: a test command transmission unit for transmitting a writing test command to the semiconductor memory device; and a data writing unit for transferring write data based on writing period information obtained from the semiconductor memory device.

The memory access device, of the present invention, for writing data by accessing the semiconductor memory device is the memory access device that comprises: a semiconductor memory device testing unit for transmitting a host writing test command to the semiconductor memory device, determining a physical address of a write starting position based on management information obtained from the semiconductor memory device, and transferring writing data; and a data writing unit for transferring the writing data based on writing period information obtained from the semiconductor memory device.

The semiconductor memory device of the present invention comprises: a nonvolatile data storing unit having a user data area for storing information and a management information area for storing management information of the semiconductor memory device; a RAM for storing data temporarily; a host interface unit for receiving a command issued from a memory access device and data, and providing a response from the semiconductor memory device and data to the memory access device; and a memory controller for controlling the host interface unit, the data storing unit and the RAM, wherein when an in-device information disclosure command is given from the memory access device, the memory controller notifies the memory access device of information about an management information area inside the semiconductor memory device. A memory controller of the present invention is the memory controller that is used in the device described above.

The memory access device, of the present invention, for writing data by accessing the semiconductor memory device is the memory access device that comprises: a device information obtaining unit for transmitting an in-device information disclosure command to the semiconductor memory device; and a data writing unit for transferring the writing data based on management information inside the device obtained from the semiconductor memory device.

According to the present invention, it is possible to recognize the writing rate corresponding to the writing conditions in the memory access device.

BRIEF DESCRIPTION OF THE DRAWINGS

FIG. 8 is a diagram showing exemplary information of a user data area in the embodiment 1;

FIG. 9 is a diagram showing an exemplary summarization result of data for measuring writing rate;

DESCRIPTION OF PREFERRED EMBODIMENTS

Hereinafter, embodiments of a memory access device, a semiconductor memory device and a memory controller of the present invention will be explained with reference to the drawings by way of examples of semiconductor memory cards.

Embodiment 1

Figure 6:
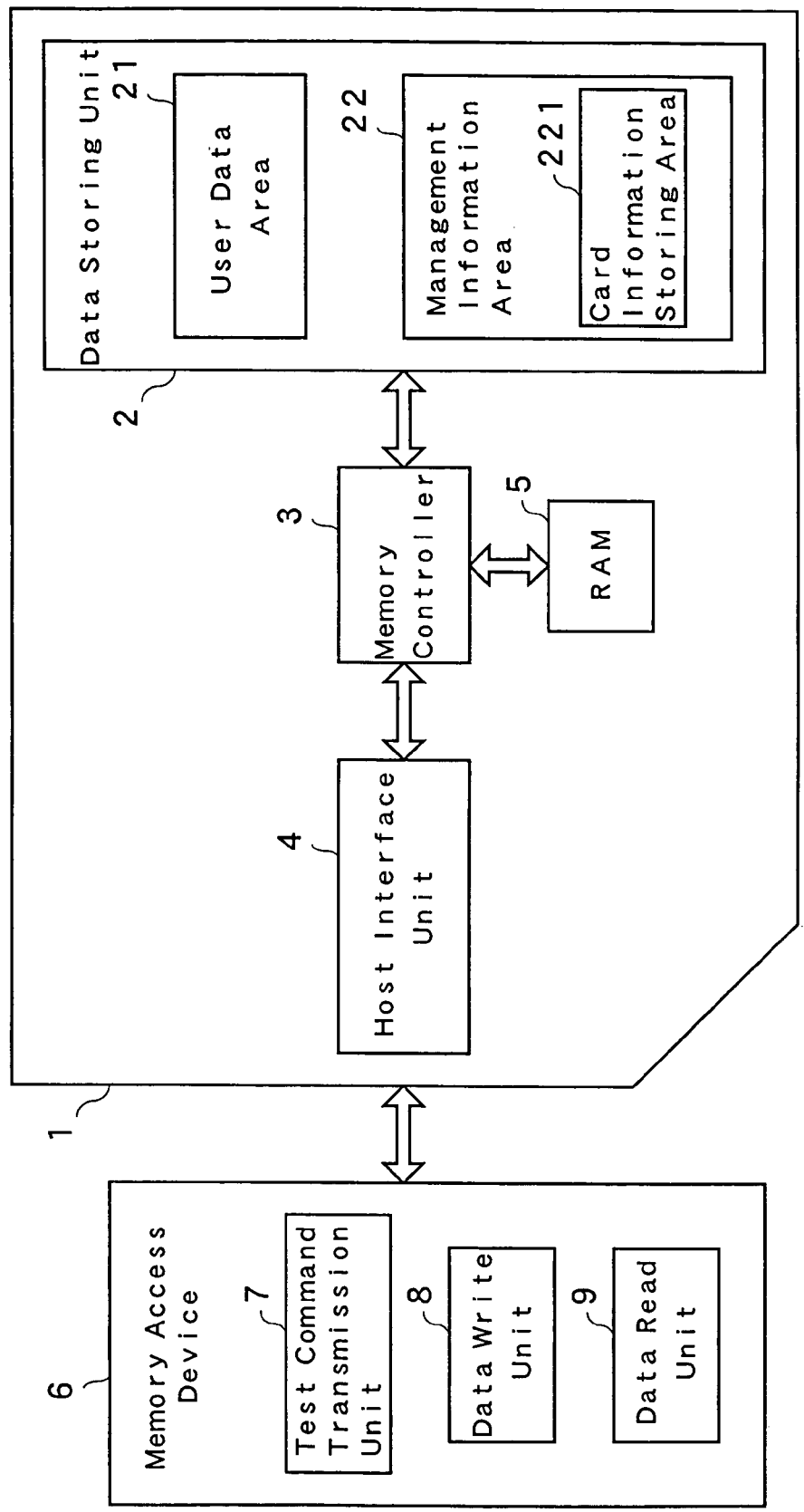
FIG. 6 is a diagram showing the configurations of a semiconductor memory card and a memory access device in an embodiment 1 of the present invention.

FIG. 6 shows the configurations of a memory access device, a semiconductor memory card and a memory controller of the embodiment 1. In FIG. 6, the semiconductor memory card 1 is composed of the data storing unit 2, a memory controller 3, a host interface unit 4, and a RAM 5. The data storing unit 2 consists of a nonvolatile memory such as a NAND-type flash memory, and has the user data area 21 and the management information area 22. The management information area 22 includes an address conversion table for converting a logical address into a physical address, and the card information storing area 221 for storing the use state of user data. In the present embodiment, the data storing unit 2 consists of one flash memory. The host interface unit 4 is configured to exchange information with the memory access device 6. The memory access device 6 has a test command transmission unit 7 for transmitting a test command to the semiconductor memory card 1, a data write unit 8 for writing data to the semiconductor memory card 1, and a data read unit 9 for reading data.

Figure 7:
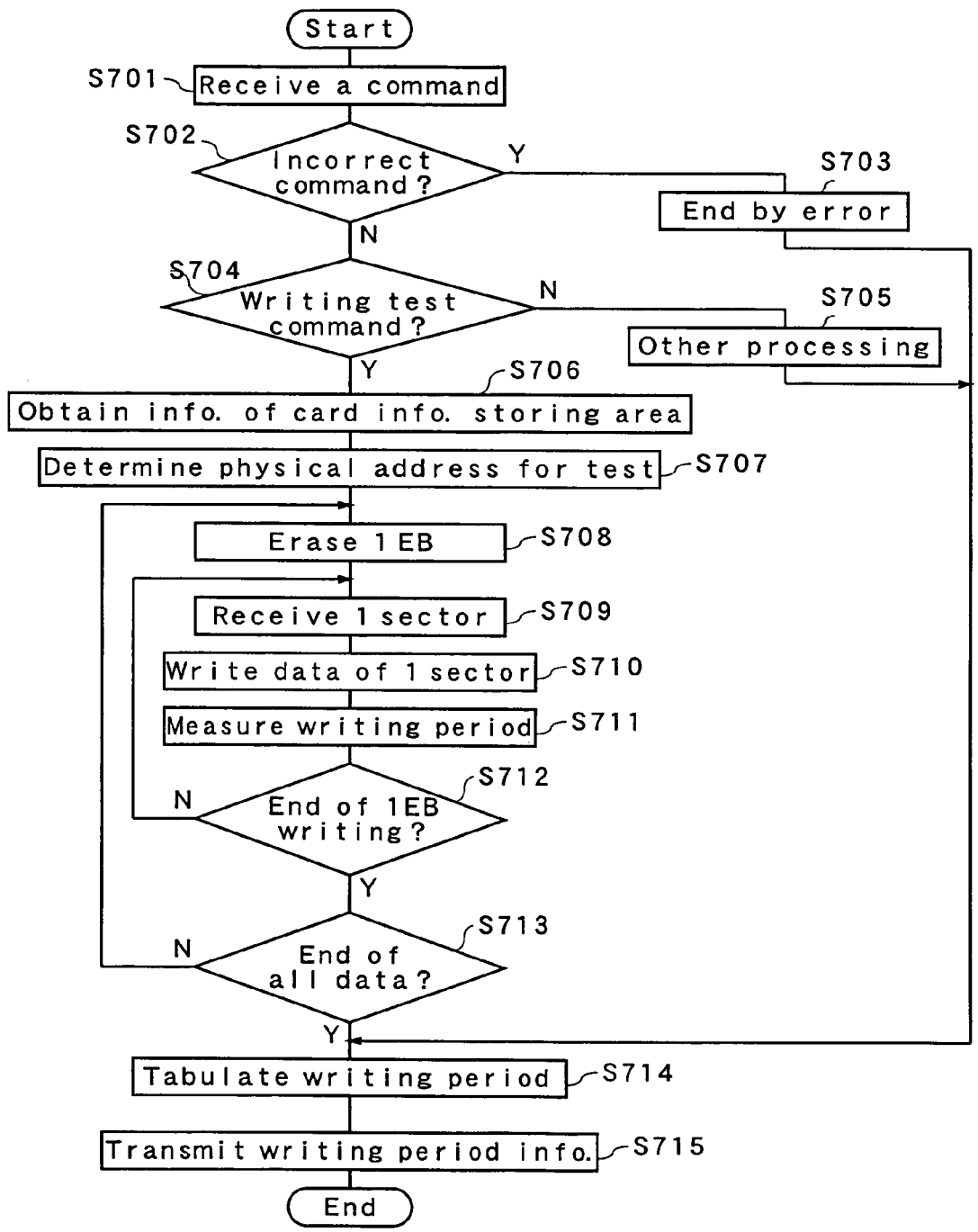
FIG. 7 is an internal processing flowchart in the embodiment 1.

Next, the internal operation of the embodiment 1 will be explained by using FIGS. 7 and 8. FIG. 7 shows a processing flow at the time of measuring the writing rate. First, the memory access device 6 transmits a writing test command from the test command transmission unit 7. At the same time, the memory access device 6 transmits the writing size to the semiconductor memory card 1. The semiconductor memory card 1 receives the command and the argument transmitted from the memory access device 6 via the host interface unit 4 (S701). Next, by referring to the received command, the semiconductor memory card 1 judges whether it is an incorrect command not being unrecognizable by itself (S702). If it is an incorrect command, the semiconductor memory card 1 notifies the memory access device 6 of an error and ends the processing (S703). If it is a normal command, the semiconductor memory card 1 judges whether the command is a writing test command (S704). If it is one other than a writing test command, the semiconductor memory card 1 performs another processing corresponding to each command (S705). When a writing test command is given with the write size, the semiconductor memory card 1 obtains information about the use state of the card information storing area 221, that is, a user data area, stored in the management information area 22 of the data storing unit 2 in step S706. FIG. 8 shows an example of information of the user data area. In FIG. 8, the table shows the use states of the physical block addresses PBA0 to PBAM by the sector number that whether it is used or not. M is the maximum value of the physical block address. Based on the information, the memory controller 3 inside the memory card determines the write position. It is preferable to include address requiring time as shown in the physical block address 1 in FIG. 8, for example. This processing is performed in the determination of a physical address for test (S707).

Next, the semiconductor memory card 1 erases data existing in the erasure block (EB), determined in S707, in the data storing unit 2 via the memory controller 3. Here, valid data is automatically saved to the RAM 5 before erasure. Next, the semiconductor memory card 1 receives data for one sector from the memory access device 6 via the host interface unit 4 (S709). Upon completion of the reception of the data, the memory controller 3 writes the received data for one sector into the data storing unit 2 (S710). The writing period in this occasion, that is, the busy time, is measured and written on the RAM 5 as shown in the table T1 of FIG. 9. In S709, S710 and S711, the semiconductor memory card 1 repeatedly performs the data reception, writing and processing of writing rate measurement for one sector until data writing for one erasure block is completed (S712). The semiconductor memory card 1 repeatedly performs the data write processing for one erasure block in S708 to S712 until data writing for the writing size designated by the memory access device 6 is completed (S713). Upon completion of the data writing for the writing size designated by the memory access device 6, the semiconductor memory card 1 tabulates data of the measured writing period by that time (S714). The table T2 in FIG. 9 shows an example of the result. In this example, the writing data size is shown as 16 kB. Then, the semiconductor memory card 1 calculates the writing period by one sector unit and the minimum value, the maximum value, and the average value thereof, and stores, in the RAM 5, the period from the time that the command from the memory access device is received to the time that the writing of the whole data is completed, and the writing data size. Then, the semiconductor memory card 1 transmits the data of the table T2 to the memory access device 6 (S715), and ends the processing.

Thereby, the memory access device 6 will be able to perform data writing to the semiconductor memory card 1 since then, based on the writing period information obtained in these steps. At this time, if the written data is dummy information, it may be erased after writing, or a flag indicating it being invalid data may be shown in the management information area 22.

Note that the type and the number of flash memories, the capacity of the physical block, the configuration and the like used in the embodiment 1 are not specified. The similar effect can be achieved with different combinations.

Further, as for a writing unit and information stored in the RAM, the similar effect can be achieved even if information other than that of the present embodiment is stored.

Embodiment 2

Figure 1:
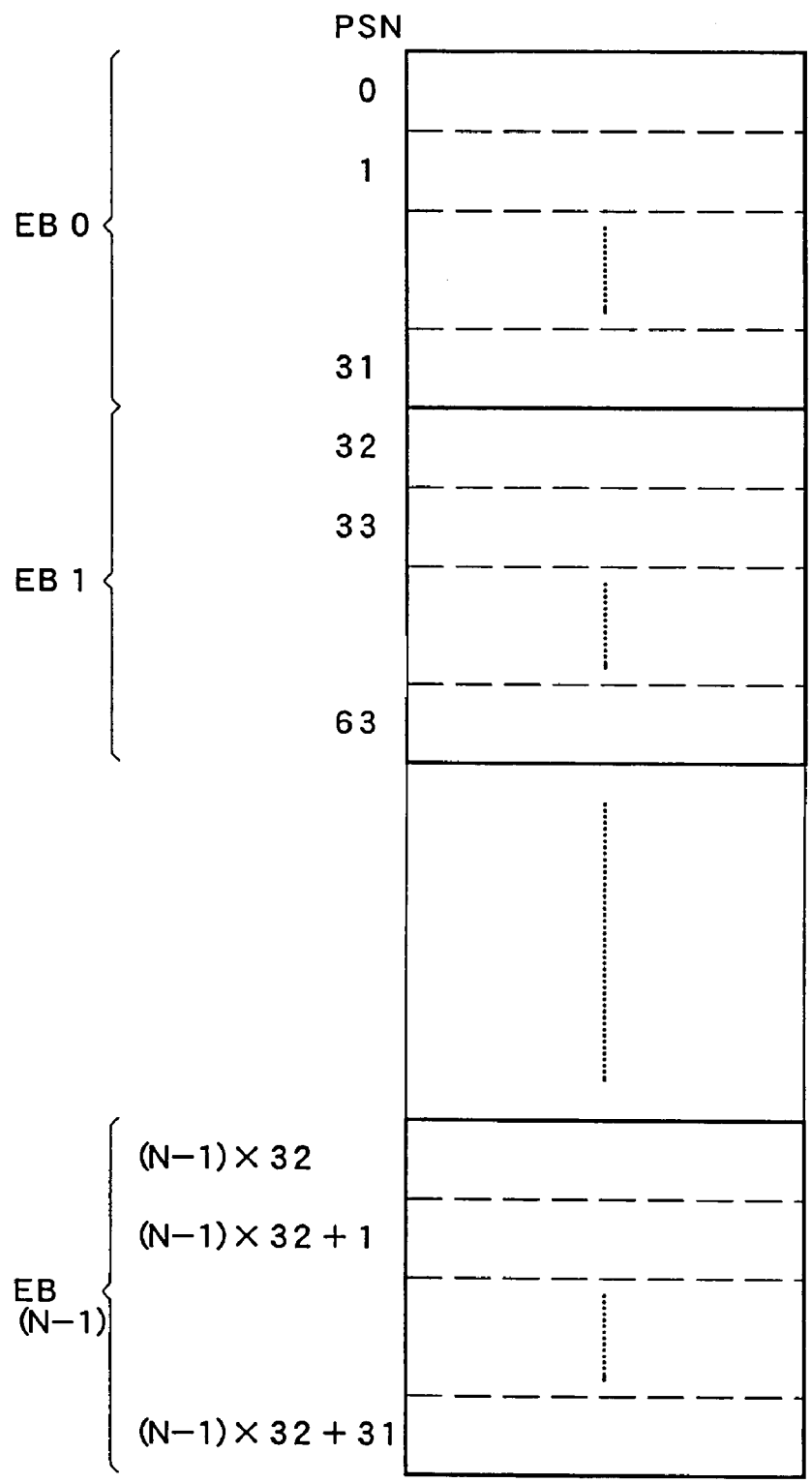
FIG. 1 is a diagram showing exemplary erasure blocks and sectors in a NAND-type flash memory.
Figure 2:
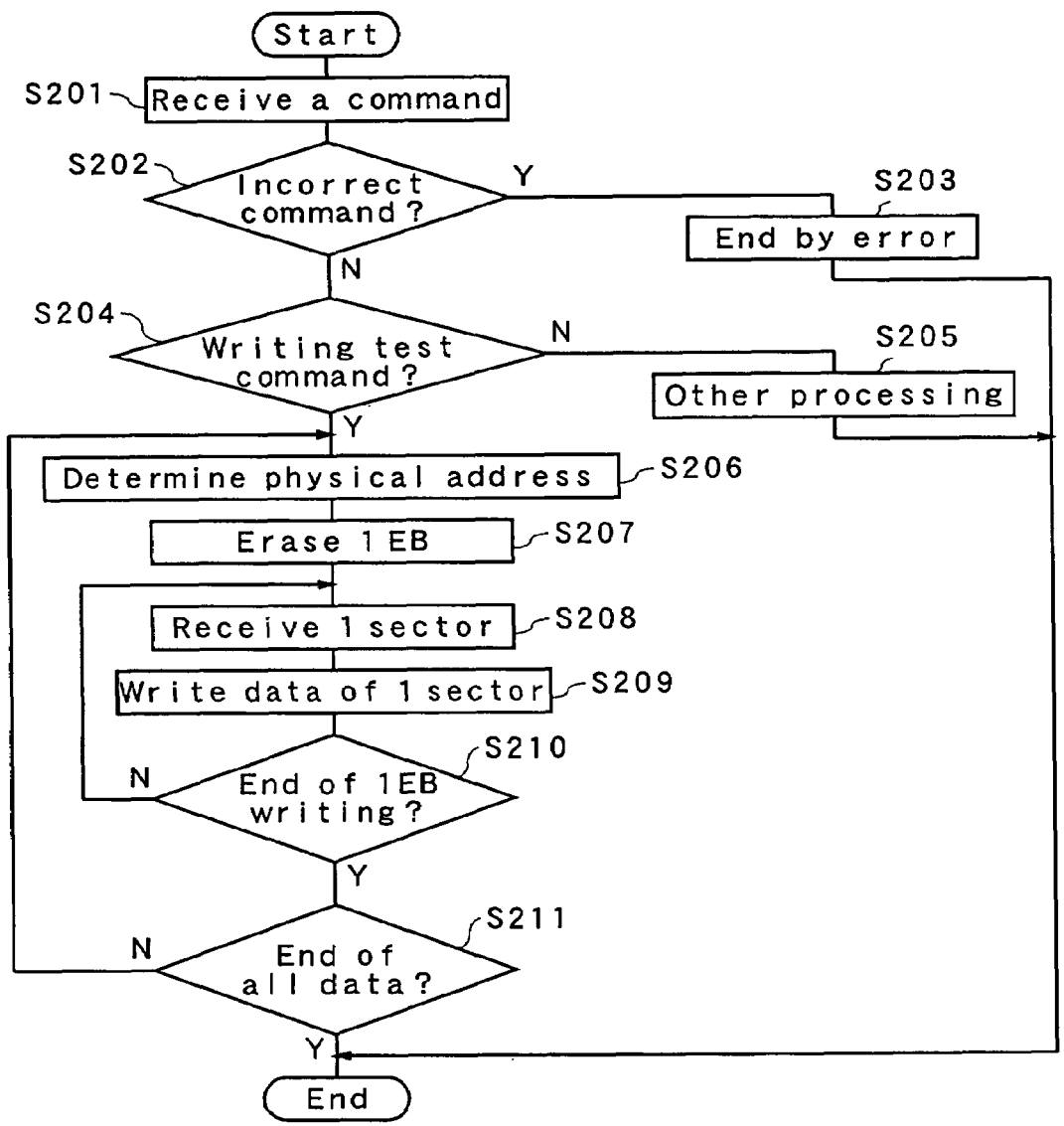
FIG. 2 is a processing flowchart showing an exemplary processing procedure inside a semiconductor memory card in a case of writing data having a multiple length of erasure block, as an example of write processing.
Figure 3:
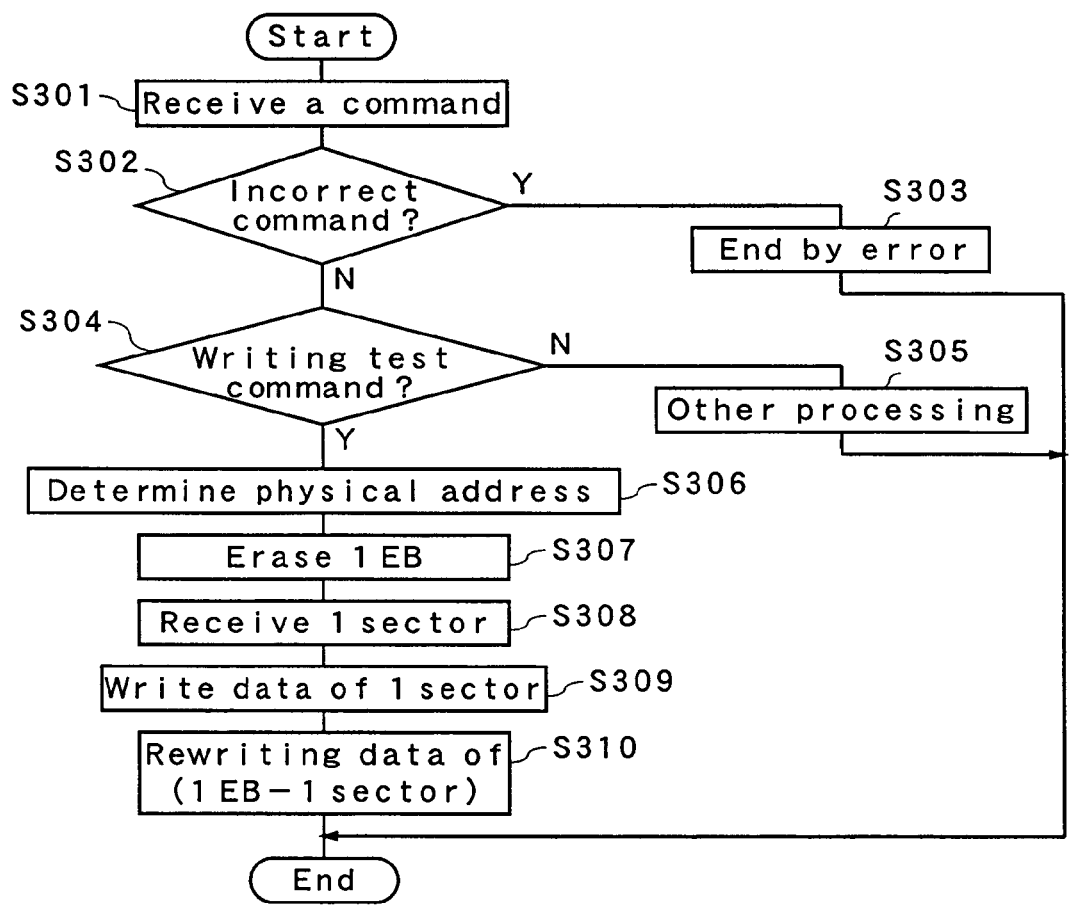
FIG. 3 is a processing flowchart showing an exemplary processing procedure inside the semiconductor memory card in a case of writing data for one sector.
Figure 4:
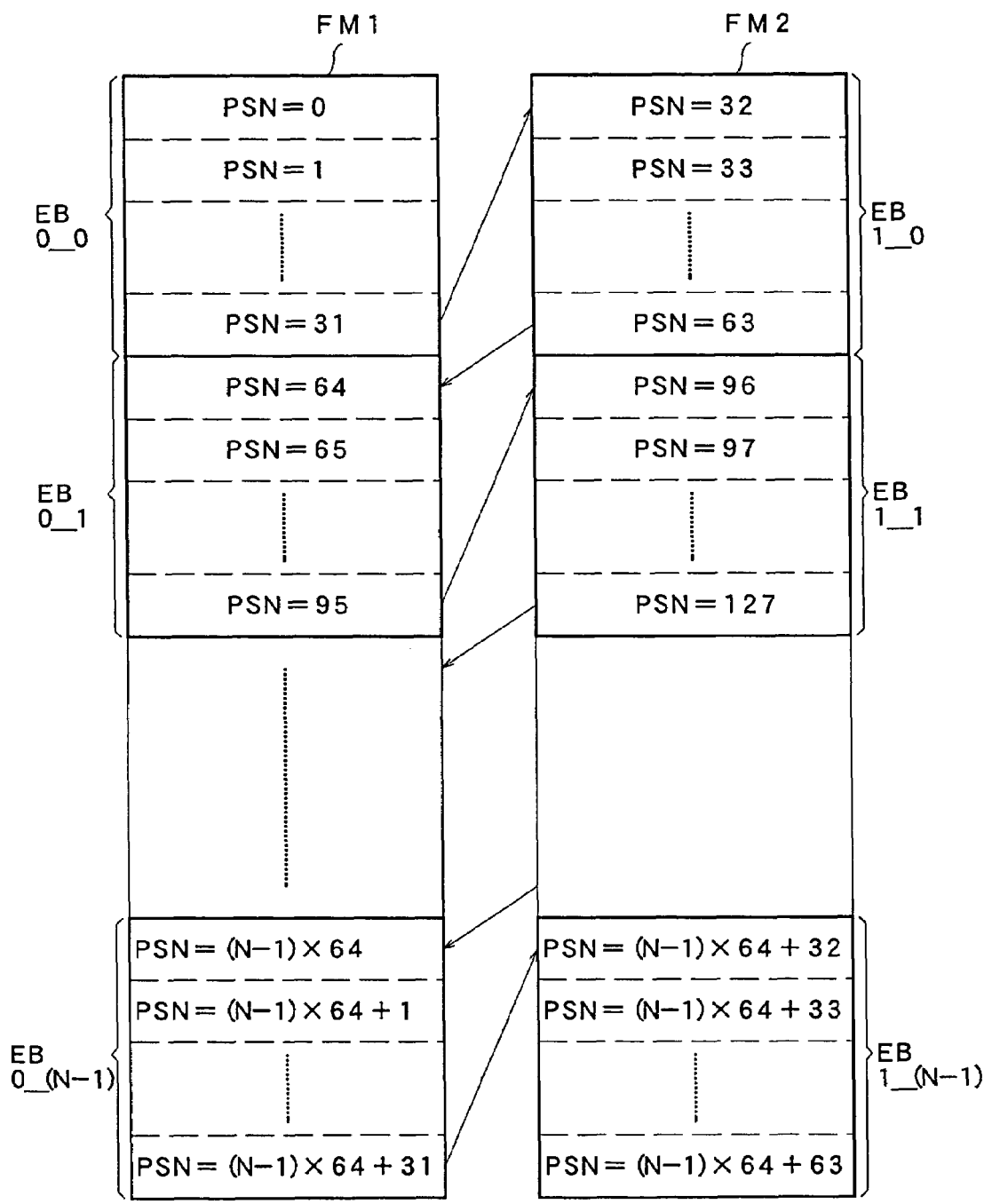
FIG. 4 is a diagram showing the exemplary configuration of a semiconductor memory card using two flash memories.
Figure 5A:
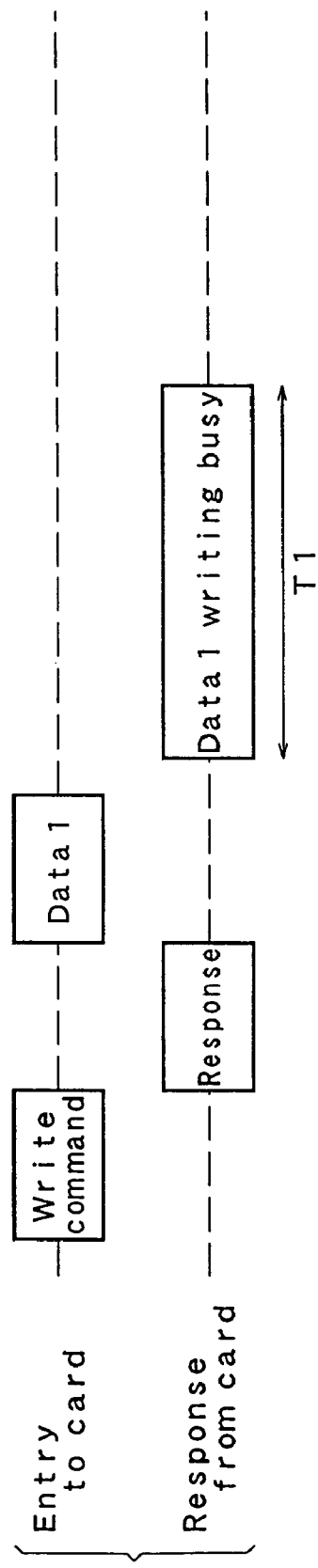
FIGS. 5(a) and 5(b) are diagrams showing examples of a timing of writing for one erasure block and a timing of writing for two erasure blocks in parallel, in the case of a semiconductor memory card being composed of two flash memories.
Figure 5B:
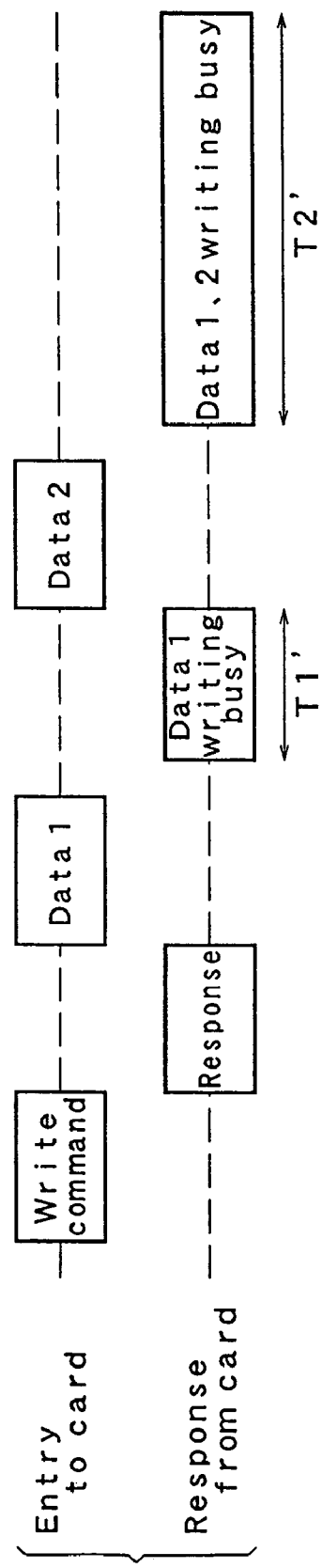

Next, a memory access device, a semiconductor memory card and a memory controller according to an embodiment 2 of the present invention will be explained. The basic configuration is same as that of FIG. 1, but the processing flow of writing rate measurement is different from that of the embodiment 1. In the embodiment 1, when a writing test is performed, information of the writing size is issued from the memory access device and all processing such as a determination of the write starting block is performed within the memory card, and writing period information is transmitted to the memory access device. On the other hand, the embodiment 2 is different in the following point, that is, the memory access device obtains internal information from the memory card, and determines the write starting block and the writing size.

Figure 10:
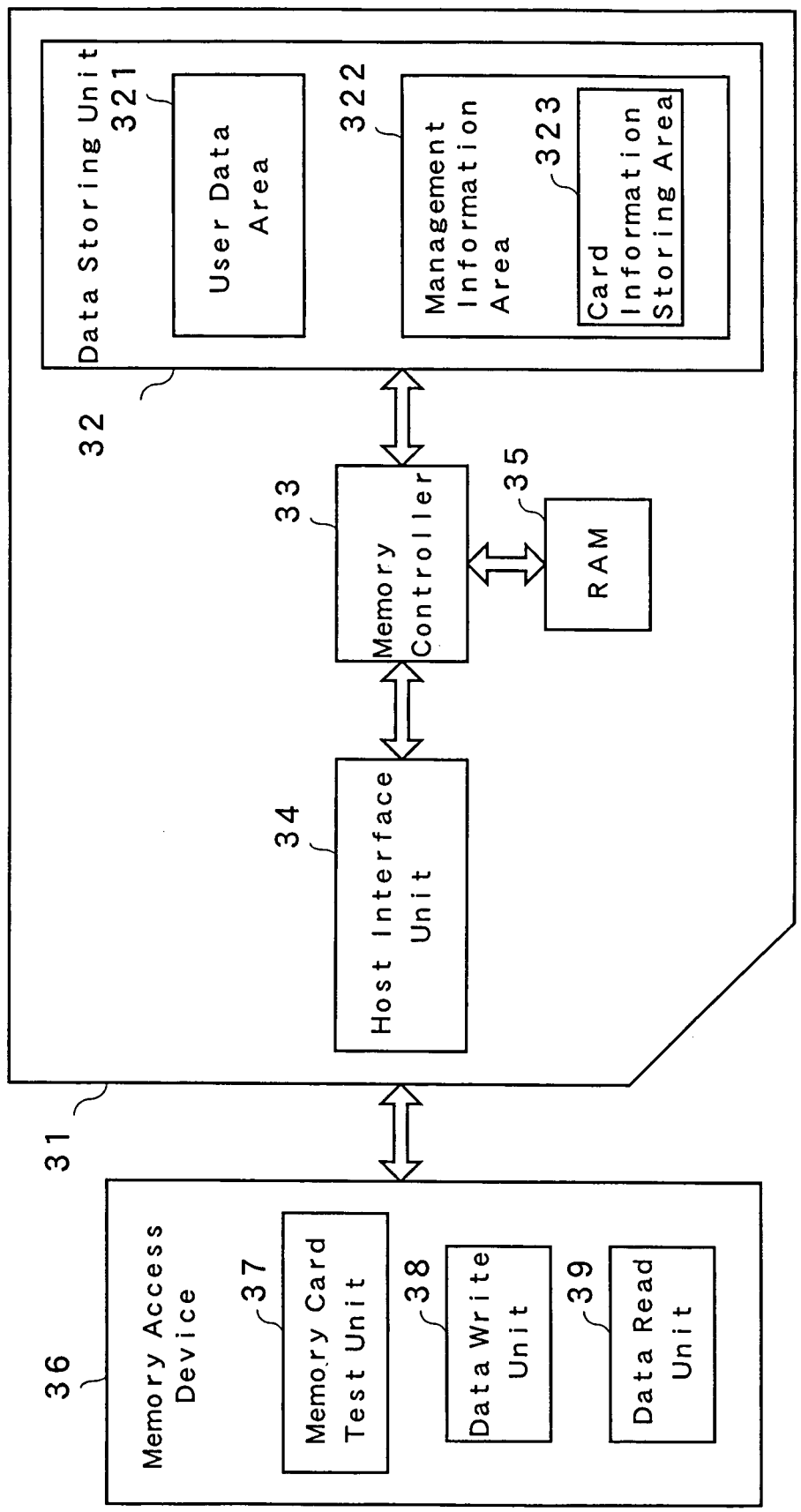
FIG. 10 is a diagram showing the configurations of a semiconductor memory card and a memory access device in the embodiment 2 of the present invention.

FIG. 10 is a block diagram showing the memory access device and the semiconductor memory card of the embodiment 2. The semiconductor memory card 31 is composed of a data storing unit 32, memory controller 33, host interface unit 34, and RAM 35. The data storing unit 32 consists of, for example, a NAND-type flash memory, and includes a user data area 321 and management information area 322. The management information area 322 includes a card information storing area 323 for storing the use state of user data. In the present embodiment, the data storing unit 32 consists of one flash memory. The host interface unit 34 is configured to exchange information with the memory access device 36. The memory access device 36 has a memory card test unit 37 which determines a physical address for transmitting and testing a host writing test command, a data writing unit 38 and a data reading unit 39.

Figure 11:
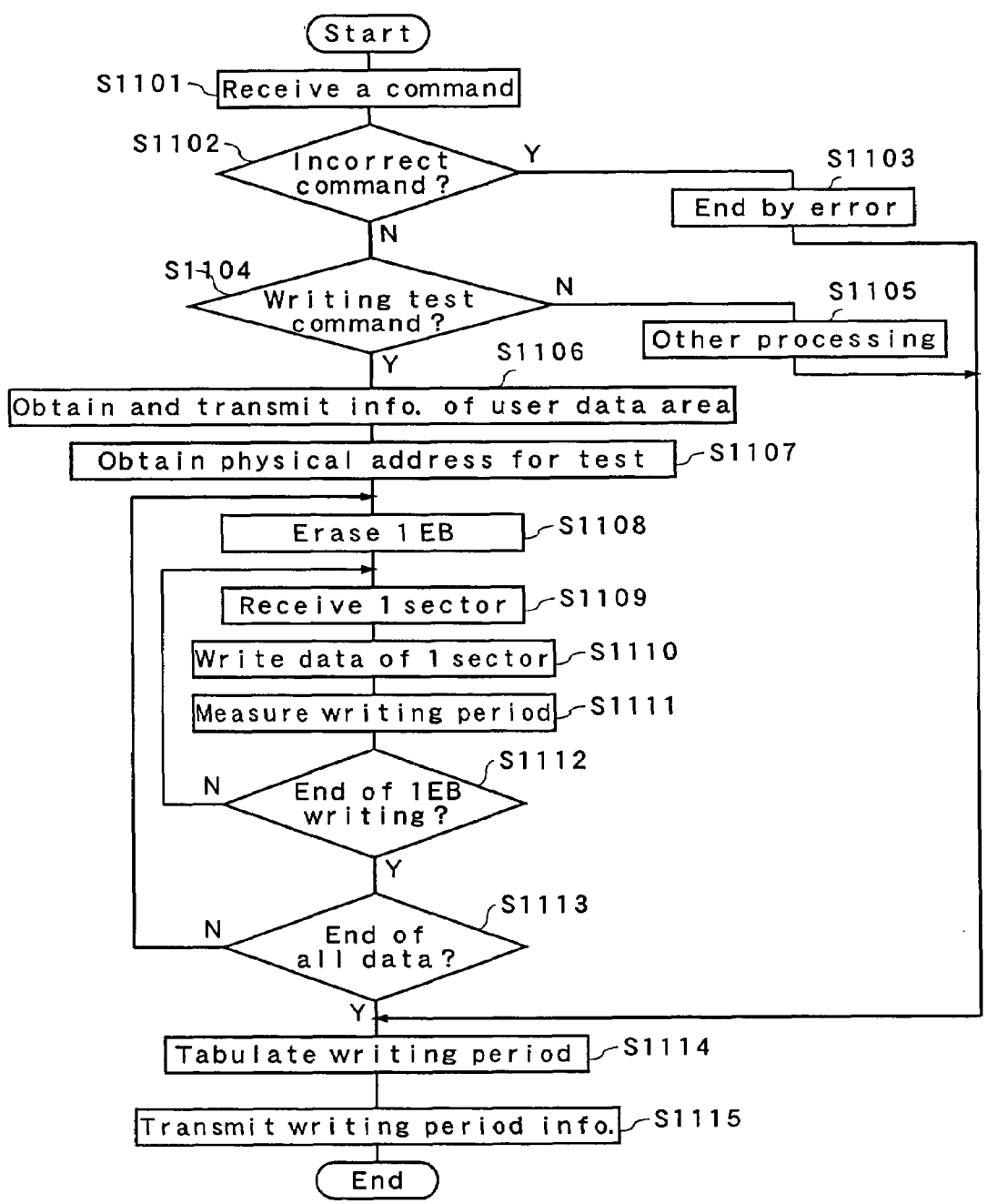
FIG. 11 is an internal processing flowchart in the embodiment 2.

Next, a case of testing a semiconductor memory in the present embodiment will be explained by using FIGS. 10 and 11. First, the semiconductor memory card 31 receives a command and an argument transmitted from the memory access device 36 via the host interface unit 34 (S1101). Next, by referring to the command received, the semiconductor memory card 31 judges whether it is an incorrect command not being unrecognizable by itself (S1102). If it is an incorrect command, the semiconductor memory card 31 notifies the memory access device 36 of an error and ends the processing (S1103). If it is a normal command, the semiconductor memory card 31 judges whether the command is a writing test command from the host (host writing test command) (S1104). If it is one other than a host writing test command, the semiconductor memory card 31 performs another processing corresponding to each command (S1105). If it is a host writing test command, the semiconductor memory card 31 obtains the use states of respective blocks and sectors, for example, the information shown in the above-described FIG. 8, stored in the management information area 322 within the data storing unit 32, and transmits them to the memory access device 36 (S1106). At the same time, the semiconductor memory card 31 also transmits an address conversion table for converting a logical address within the data storing unit 32 to a physical address, and the like. The memory card test unit 37 of the memory access device 36 determines the physical address of the write starting position and the like according to the information obtained in S1106 and information about the writing data size and the like held by itself, and transmits the information to the memory card 31. The semiconductor memory card 3 receives the information transmitted from the memory access device 36 (S1107).

Next, the memory controller 33 erases data existing in the erasure block, determined in S1107, in the data storing unit 32. If there is valid data at this time, it is automatically saved to the RAM 35 before erasure. Next, the memory card 31 receives data for one sector from the memory access device 36 (S1109). Upon completion of the data reception, the memory controller 33 writes the received data for one sector to the data storing unit 32 (S1110). The memory controller 33 measures the writing period of this time, that is, the busy time, writes it on the RAM 35. The memory controller 33 repeatedly performs the data reception, writing and writing rate measurement processing for one sector of S1109, S1110 and S1111 until data writing for one erasure block is completed (S1112). The memory controller 33 repeatedly performs the data write processing for one erasure block of S1108 to S1112 until data writing for the writing size designated by the memory access device 36 is completed (S1113). Upon completion of the data writing for the writing size designated by the memory access device 36, the memory controller 33 tabulates data of the measured writing period by that time (S1114). An example of the result is shown in the above-described FIG. 9. The memory controller 33 stores, in the RAM 35, the writing period by one sector unit and the minimum value, the maximum value and the average value thereof, and the period from the time that the command from the memory access device is received to the time that the writing of the whole data is completed, and the writing data size. Then, the memory controller 33 transmits the data to the memory access device 36 (S1115), and ends the processing.

Thereby, the memory access device 36 will be able to perform data writing to the semiconductor memory card 31 since then, based on the writing period information obtained in these steps. At this time, if the written data is dummy information, it may be erased after writing, or a flag indicating it being invalid data may be shown in the management information area.

Embodiment 3

Figure 12:
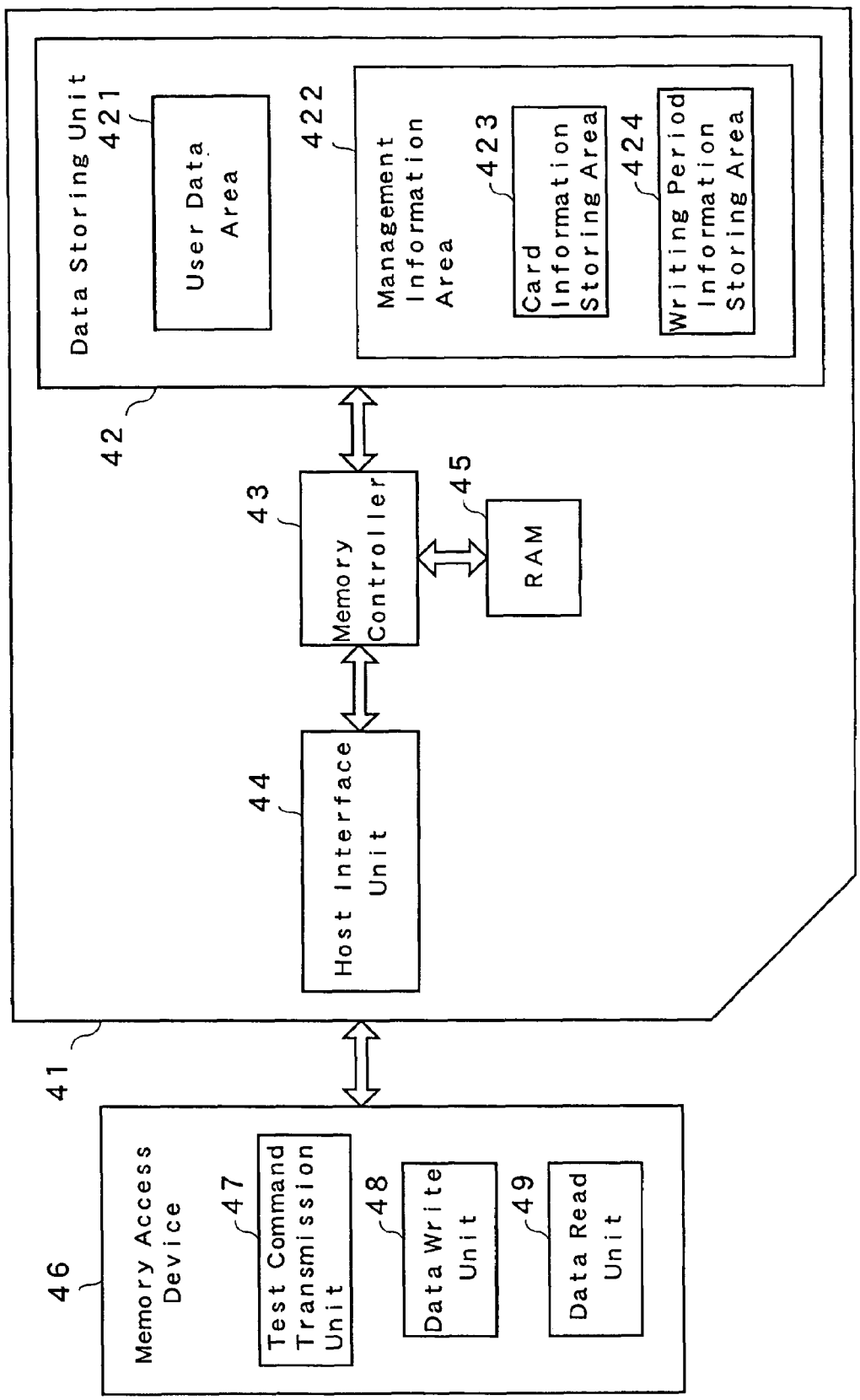
FIG. 12 is a diagram showing the configurations of a semiconductor memory card and a memory access device in an embodiment 3 of the present invention.

Next, the configurations of a memory access device, a semiconductor memory card and a memory controller according to an embodiment 3 of the present invention is shown in FIG. 12. FIG. 12 is a block diagram showing the memory access device and the semiconductor memory card of the embodiment 3. The semiconductor memory card 41 is composed of a data storing unit 42, memory controller 43, host interface unit 44, and RAM 45. The data storing unit 42 consists of, for example, a NAND-type flash memory, and includes a user data area 421 and management information area 422. The management information area 422 has a card information storing area 423 for storing the use state of the user data area, and writing period information storing area 424 for storing information about writing period. The writing period information storing area 424 is an area for retaining information about writing period stored in the RAM at the time of measuring the writing period in the embodiments 1 and 2. That is, although, in the embodiments 1 and 2, measured information is lost when the power of the memory card is turned off, in the embodiment 3, the information is not lost but retained. In the present embodiment, the data storing unit 42 consists of one flash memory. The host interface unit 44 is configured to exchange information with the memory access device 46. The memory access device 46 has a test command transmission unit 47 for transmitting a test command to the semiconductor memory card 41, a data writing unit 48 and a data reading unit 49.

Figure 13:
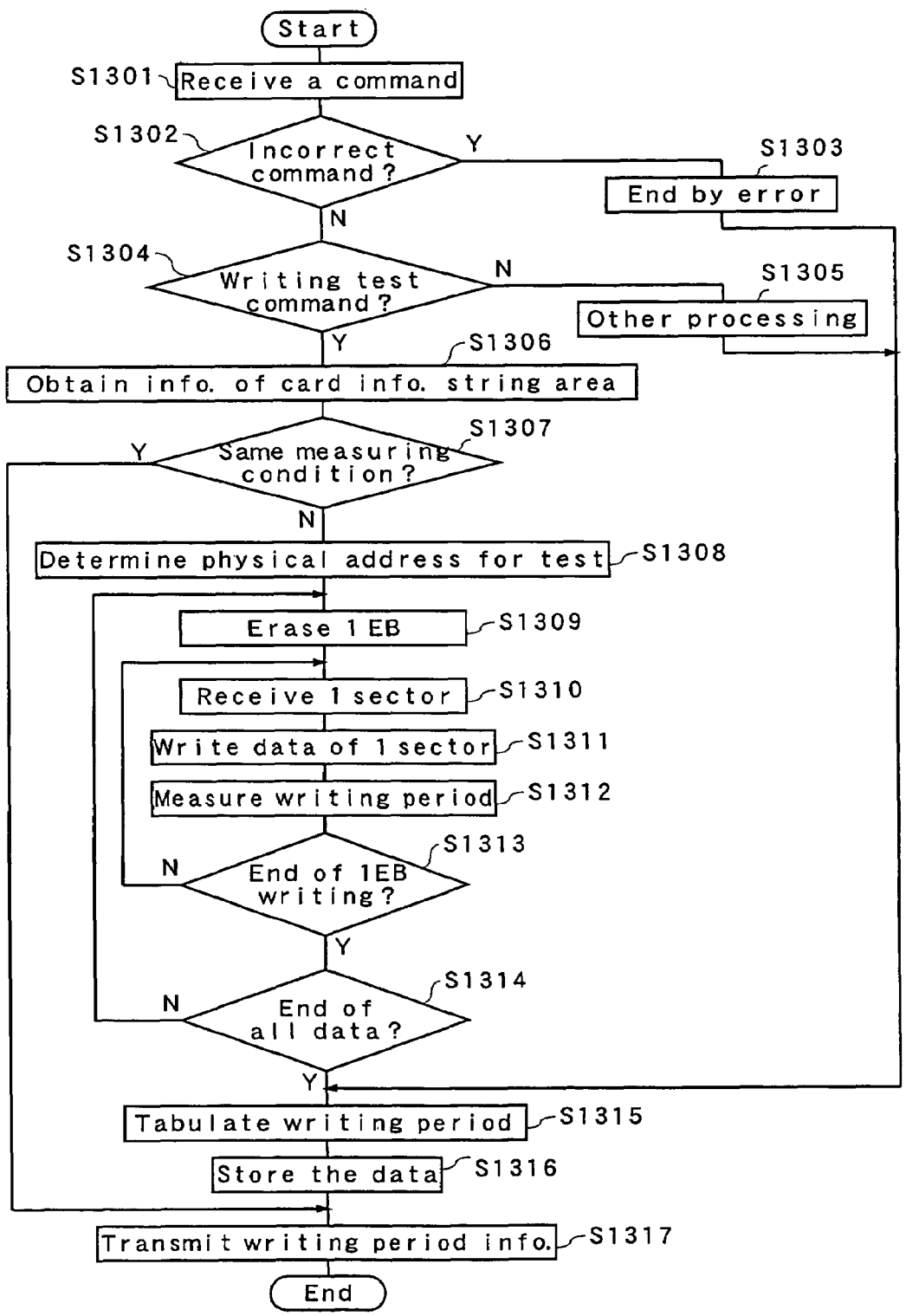
FIG. 13 is an internal processing flowchart in the embodiment 3.

FIG. 13 shows the processing flow at the time of measuring the writing rate. First, the semiconductor memory card 41 receives a command and an argument transmitted from the memory access device 46 (S1301). Next, by referring to the command received, the semiconductor memory card.41 judges whether it is an incorrect command not being unrecognizable by itself (S1302). If it is an incorrect command, the semiconductor memory card 41 notifies the memory access device of an error and ends the processing (S1303). If it is a normal command, the semiconductor memory card 41 judges whether the command is a writing test command (S1304). If it is one other than a writing test command, the semiconductor memory card 41 performs another processing corresponding to each command (S1305). If it is a writing test command, the semiconductor memory card 41 checks the measured writing period information (specific example thereof is shown in the above-described FIG. 9) stored in the writing period storing area 424 within the management information area 422 of the data storing unit 42. Measurement data of the same condition may be the writing period information having the same writing size. Further, among those of the same writing size, several patterns may be prepared corresponding to the used states of the user data area of the data storing unit 42, and the writing period information matching the state may be selected. If there is data of the same condition (S1307), the semiconductor memory card 41 transmits the writing period information to the memory access device 46 (S1317), and ends the processing.

Further, if there is no measured data of the same condition (S1307), the semiconductor memory card 41 obtains information about the writing size stored in the argument of the writing test command, and information about the used state of the card information area, that is, the user data area, stored in the management information area 422 inside the memory card. As shown in the above-described FIG. 8, information of the user area retains information of the use states of sectors within the physical block address. Based on the information, the memory controller 43 inside the memory card determines the writing position. This processing is performed in the determination of the physical address for testing (S1308).

Next, the semiconductor memory card 41 erases data existing in the erasure block (EB), determined in S1308, in the user data area 421 of the data storing unit 42 via the memory controller 43 (S1309). If there is valid data at this time, it is automatically copied to the RAM 45 before erasure. Next, the semiconductor memory card 41 receives data for one sector from the memory access device 46 via the host interface unit 44 (S1310). Upon completion of the data reception, the memory controller 43 writes the received data for one sector to the user data area 421 of the data storing unit 42 (S1311). The memory controller 43 measures the writing period of this time, that is, the busy time, and writes it on the RAM 45. The memory controller 33 repeatedly performs the data reception, writing and writing rate measurement processing for one sector of S1310, S1311 and S1112 until data writing for one erasure block is completed (S1313). The memory controller 43 repeatedly performs the data write processing for one erasure block of S1309 to S1313 until data writing for the writing size designated by the memory access device 46 is completed (S1314). Upon completion of the data writing for the writing size designated by the memory access device 46, the memory controller 43 tabulates data of the measured writing period by that time (S1315). An example of the result is shown in the above-described FIG. 9. The memory controller 43 stores, in the RAM 5, the writing period by one sector unit and the minimum value, the maximum value, and the average value thereof, and the period from the time that the command from the memory access device is received to the time that the writing of the whole data is completed, and the writing data size. Then, the memory controller 43 stores the data on the RAM 45 in the writing period information storing area 424 (S1316), and transmits the data to the memory access device 46 (S1317), and ends the processing. Thereby, pieces of data of various measurement conditions are stored in the writing period information storing area 424, so measurement processing before writing may not be required in many cases, whereby it is possible to perform writing test rapidly.

Note that the measurement of writing rate may be performed at the time of step inspection at the manufacturing factory after the semiconductor memory card has been manufactured. In such a case, a transfer rate measurement is performed and the obtained data is stored in the writing period information storing area 424 of the data storing unit 42, before the memory card is shipped from the factory.

Note that although, in step S1308, the physical address for testing is determined within the semiconductor memory card, information of the user data area may be transmitted to the memory access device and the physical address for testing may be determined within the memory access device, as shown in the embodiment 2. In such a case, the information about the physical address for testing determined in the memory access device is obtained and tested, and then the result is retained in the nonvolatile data storing unit 42.

Embodiment 4

Next, a memory access device, a semiconductor memory card and a memory controller according to the embodiment 4 of the present invention will be explained. The basic configuration is same as that of FIG. 1, but the memory access device is so configured as to transmits an in-card information disclosure command to the semiconductor memory card, and the semiconductor memory card returns the memory used state inside the card corresponding to the information disclosure command.

Figure 14:
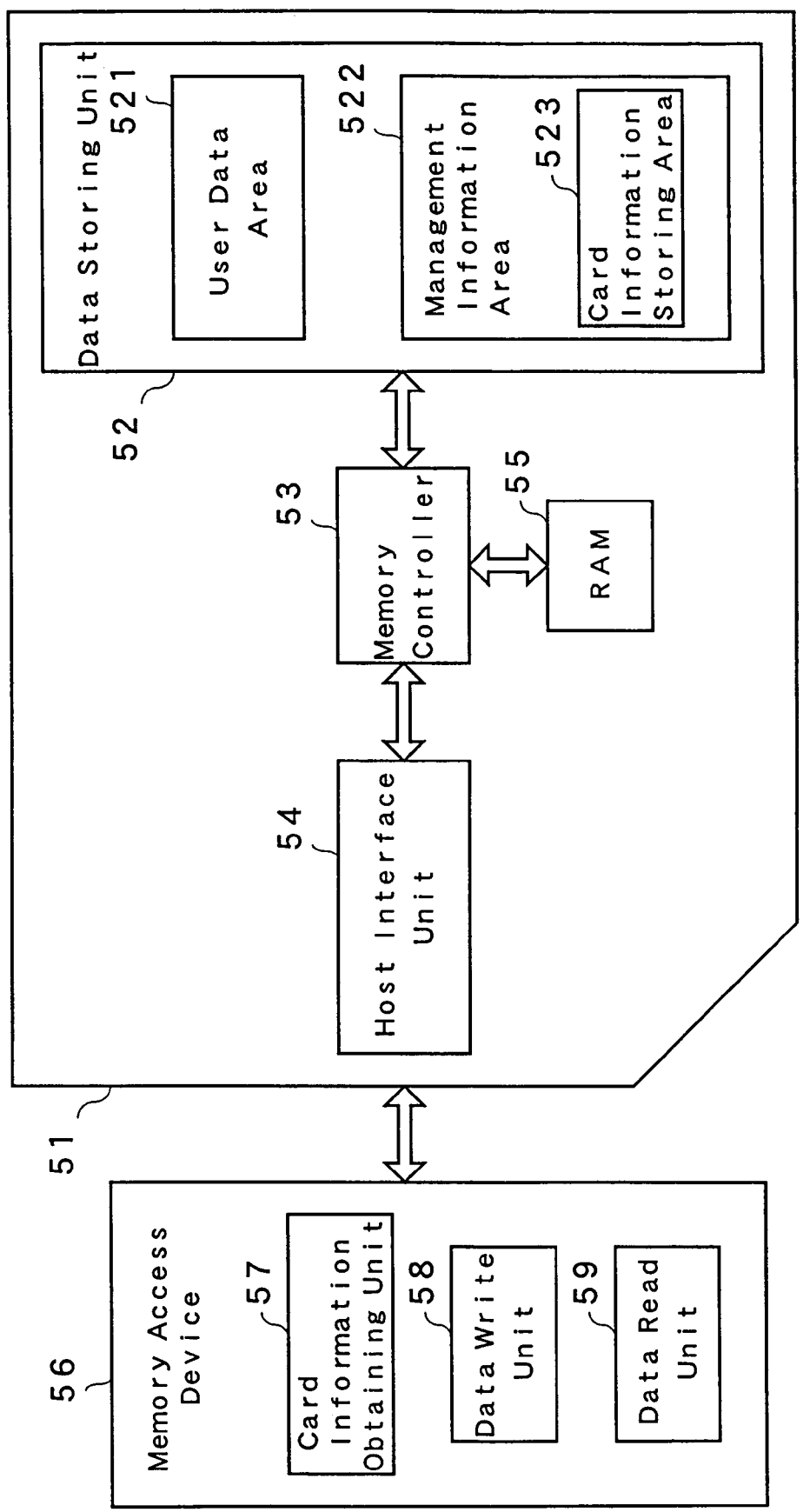
FIG. 14 is a diagram showing the configurations of a semiconductor memory card and a memory access device in an embodiment 4 of the present invention.

FIG. 14 is a block diagram showing the memory access device and the semiconductor memory card of the embodiment 4. The semiconductor memory card 51 is composed of a data storing unit 52, memory controller 53, host interface unit 54, and RAM 55. The data storing unit 52 consists of, for example, a NAND-type flash memory, and includes a user data area 521 and management information area 522. In the present embodiment, the data storing unit 52 consists of one flash memory. The host interface unit 54 is configured to exchange information with the memory access device 56. The memory access device 56 has a card information obtaining unit 57 which issues an in-card information disclosure command so as to check the use state of user data of the semiconductor memory card 51, data writing unit 58 and data reading unit 59.

Figure 15:
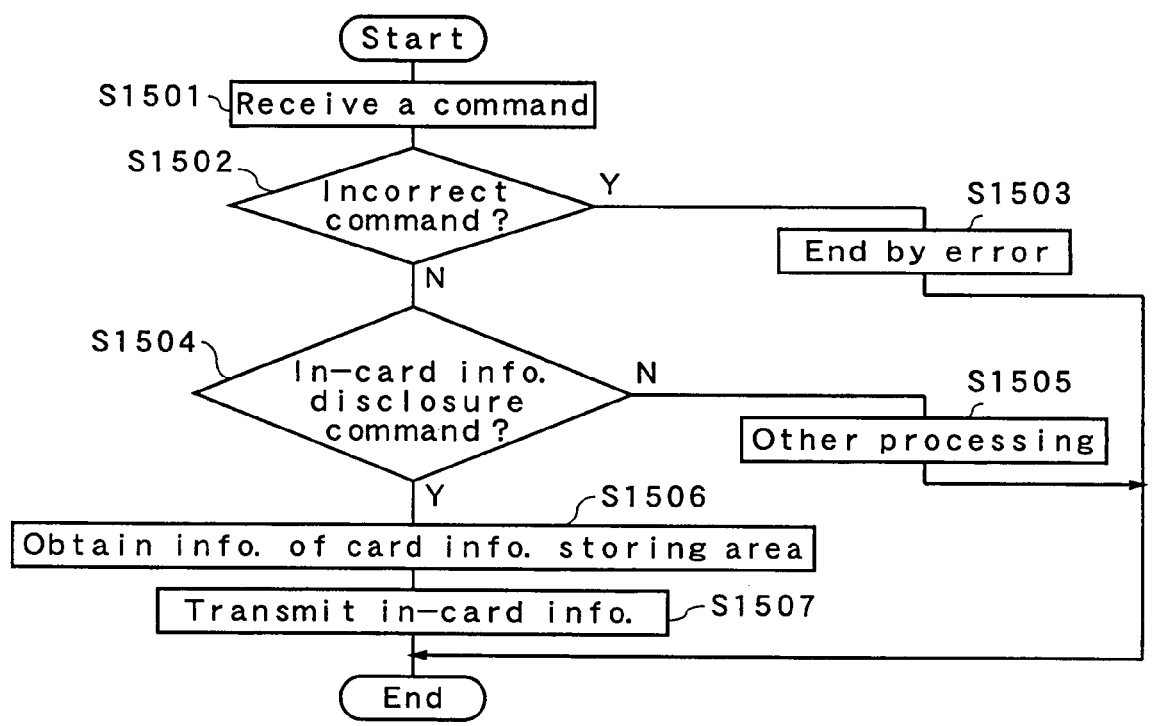
FIG. 15 is an internal processing flowchart in the embodiment 4.

FIG. 15 is a flowchart showing the operation when the memory access device 56 obtains information of user data of the semiconductor memory card 51. First, the semiconductor memory card 51 receives a command and an argument transmitted from the memory access device 56 (S1501). Next, by referring to the received command, the semiconductor memory card 51 judges whether it is an incorrect command not being unrecognizable by itself (S1502). If it is an incorrect command, the semiconductor memory card 51 notifies the memory access device of an error and ends the processing (S1503). If it is a normal command, the semiconductor memory card 51 judges whether the command is an in-card information disclosure command (S1504). If it is one other than an in-card information disclosure command, the semiconductor memory card 51 performs another processing corresponding to each command (S1505). If it is an in-card information disclosure command, the semiconductor memory card 51 obtains information about the use state of the writing area, that is, the user data area, stored in the management information area 522, based on the information stored in the argument (S1506). An example of the obtained information is same as that shown in the above-described FIG. 8, and the information about the use states of the sectors inside the physical block address is retained as an entry table. The semiconductor memory card 51 transmits this information to the memory access device 56 (S1507), and ends the processing.

In this case, the memory access device 56 is capable of determining to which physical block it writes the data based on the use state, and recognizing the writing rate according to the information within the card.

The memory access device and the semiconductor memory device relating to the present invention are capable of realizing high-speed access to the semiconductor memory device by optimizing processing of either the memory access device or the semiconductor memory device, or the both. Such a semiconductor memory device and a memory access device can be used in digital equipment, a cellular phone unit, a PC and the like in which a semiconductor memory device is used as a recording medium. In particular, they work preferably when used in a recording medium or equipment in which high quality AV data of high transfer rate is recorded.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A semiconductor memory device comprising:
a nonvolatile data storing unit having a user data area for storing information and a management information area for storing management information of the semiconductor memory device; a RAM for storing data temporarily; a host interface unit for receiving a command issued from a memory access device and data, and providing a response from the semiconductor memory device and data to the memory access device; and a memory controller for controlling the host interface unit, the data storing unit and the RAM, wherein when a writing test command is given from the memory access device, the memory controller performs a writing test to an area determined according to an inner state of the semiconductor memory device, and notifies the memory access device of a measurement result of a writing period.

2. The semiconductor memory device according to claim 1, wherein the memory controller selects a writing area according to a used state of the data storing unit when performing the writing test.

3. The semiconductor memory device according to claim 1, wherein the memory controller performs writing to an area of the data storing unit designated by the memory access device when performing the writing test.

4. The memory access device for writing data by accessing the semiconductor memory device according to claim 3, the memory access device comprising:
a semiconductor memory device testing unit for transmitting a writing test command to the semiconductor memory device, determining a physical address of a write starting position based on management information obtained from the semiconductor memory device, and transferring writing data; and a data writing unit for transferring the writing data based on writing period information obtained from the semiconductor memory device.

5. The semiconductor memory device according to claim 1, wherein the data storing unit has a writing period information storing area for storing writing period information in the management information area.

6. The memory access device for writing data by accessing the semiconductor memory device according to claim 1, the memory access device comprising: a test command transmission unit for transmitting a writing test command to the semiconductor memory device; and a data writing unit for transferring write data based on writing period information obtained from the semiconductor memory device.

7. A memory controller used for a semiconductor memory device comprising: a nonvolatile data storing unit having a user data area for storing information and a management information area for storing management information of the semiconductor memory device; a RAM for storing data temporarily; and a host interface unit for receiving a command issued from a memory access device and data and providing a response and data from the semiconductor memory device to the memory access device, wherein when a writing test command is given from the memory access device, the memory controller performs a writing test to an area determined according to an inner state of the semiconductor memory device, and notifies the memory access device of a measurement result of a writing period.

8. The memory controller according to claim 7, wherein the memory controller selects a writing area according to a used state of the data storing unit when performing the writing test.

9. The memory controller according to claim 7, wherein the memory controller performs writing to an area of the data storing unit designated by the memory access device when performing the writing test.

* * * * *